United States Patent [19]
Wu

[11] Patent Number: 5,994,176
[45] Date of Patent: Nov. 30, 1999

[54] METHOD FOR FORMING SELF-ALIGNED SILICIDED MOS TRANSISTORS WITH ASYMMETRIC ESD PROTECTING TRANSISTORS

[75] Inventor: Shye-Lin Wu, Hsinchu, Taiwan

[73] Assignee: Texas Instruments - Acer Incorporated, Hsinchu, Taiwan

[21] Appl. No.: 09/025,971

[22] Filed: Feb. 19, 1998

[51] Int. Cl.[6] ............................................. H01L 21/8238
[52] U.S. Cl. ........................ 438/200; 438/275; 438/302
[58] Field of Search ................................... 438/200, 275, 438/302

[56] References Cited

U.S. PATENT DOCUMENTS

| | | | |
|---|---|---|---|
| 5,516,717 | 5/1996 | Hsu | 438/275 |
| 5,529,941 | 6/1996 | Huang | 438/200 |
| 5,554,544 | 9/1996 | Hsu | 438/302 |
| 5,585,299 | 12/1996 | Hsu | 438/275 |
| 5,618,740 | 4/1997 | Huang | 438/224 |
| 5,672,527 | 9/1997 | Lee | 438/275 |
| 5,877,048 | 3/1999 | Wu | 438/199 |
| 5,897,348 | 4/1999 | Wu | 438/200 |
| 5,905,284 | 5/1999 | Fujii et al. | 257/335 |
| 5,910,672 | 6/1999 | Iwamatsu et al. | 257/347 |
| 5,917,218 | 6/1999 | Choi et al. | 257/345 |
| 5,920,774 | 7/1999 | Wu | 438/224 |

OTHER PUBLICATIONS

Hirotsugu Nagayama et al., A New Process for Silica Coating, J. Electrochem Soc.: Solid–State Science and Technology, Aug. 1988, pp. 2013–2016.

P. Fornara et al., Modeling of Local Reduction in $TiSi_2$ and $CoSi_2$ Growth Near Spacers in MOS Technologies: Influence of Mechanical Stress and Main Diffusing Species, 1996 IEEE, pp. 73–76.

Ajith Amerasekera et al., Correlating Drain Junction Scaling, Salicide Thickness, and Lateral NPN Behavior, with the ESD/EOS Performance of a 0.25 $\mu$m CMOS Process, 1996 IEEE, pp. 893–896.

Francesco La Via et al., Electrical Characterization of Ultra–Shallow Junctions Formed by Diffusion from a $CoSi_2$ Layer, IEEE Transactions on Electron Devices, vol. 44, No. 4, Apr. 1997, pp. 526–534.

*Primary Examiner*—John F. Niebling
*Assistant Examiner*—John Murphy
*Attorney, Agent, or Firm*—Harness, Dickey & Pierce, P.L.C.

[57] ABSTRACT

The method of forming a MOS transistor in a semiconductor substrate with the self-aligned silicide contact for ESD protection includes the following steps. At first, an isolation region is formed to separate an ESD protective region and a functional region. A gate insulator layer and a polysilicon layer are formed. The polysilicon layer is then patterned to form a gate structure. The substrate is doped to form a lightly doped region and the ESD protective region is then doped to have a junction region. A covering layer is then formed over the ESD protective region and a first dielectric layer is formed. A portion of the first dielectric layer is removed to form a spacer structure. A silicidation process is performed to form a metal silicide layer and the metal silicide layer is then doped. A second dielectric layer is formed and a thermal process is then performed to form a junction region in the functional region.

23 Claims, 4 Drawing Sheets

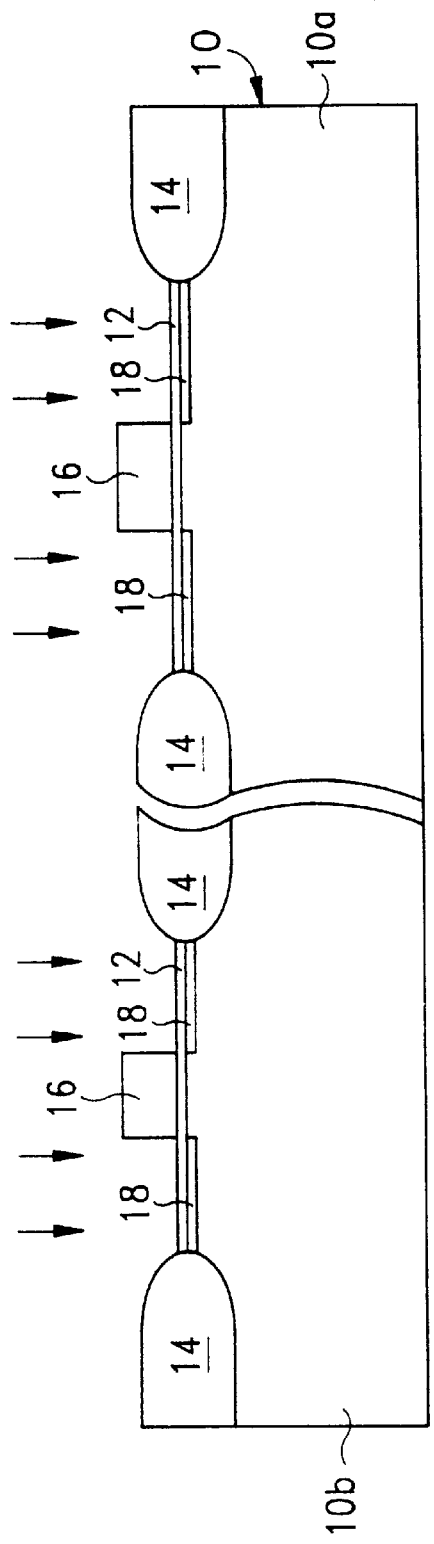
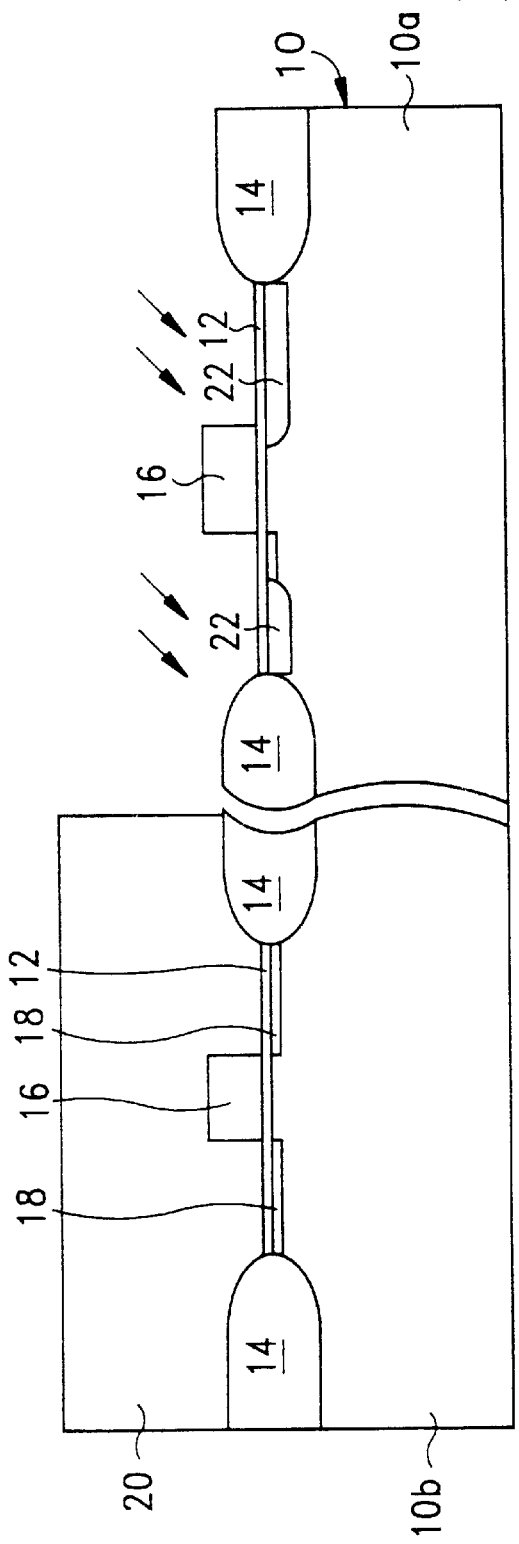

METHOD FOR FORMING SELF-ALIGNED SILICIDED MOS TRANSISTORS WITH ASYMMETRIC ESD PROTECTING TRANSISTORS

FIELD OF THE INVENTION

The present invention relates to the transistors in semiconductor manufacturing, and more specifically, to a method of forming self-aligned silicided MOS (metal oxide semiconductor) transistor with asymmetric ESD (electrostatic discharge) protecting transistors in the semiconductor manufacturing processes.

BACKGROUND OF THE INVENTION

With the progress in the semiconductor integrated circuits reaching ULSI (ultra large scale integration) level or even higher level, the integrity of the integrated circuits rises in an amazing rate. The capacity of a single semiconductor chip increases from several thousand devices to hundreds of million devices, or even billions of devices. Taking DRAM (dynamic random access memories) for example, the increasing integrity in manufacturing extends the capacity of a single chip to step from earlier 4 megabit to 16 megabit, and further to 256 megabit or even higher.

Integrated circuits devices like transistors, capacitors, and connections must be greatly narrowed accompanying with the advancement. The increasing packing density of integrated circuits generates numerous challenges to the semiconductor manufacturing process. Every element or device needs to be formed within smaller area without influencing the characteristics and functionality of the integrated circuits. The demands on high packing density, low heat generation, and low power consumption devices with good reliability and long operation life must be maintained without any degradation in the functionality. These achievements are expected to be achieved with simultaneous developments and advancements in the photography, the etching, the deposition, the ion implantation, and the thermal processing technologies, the big five aspects of semiconductor manufacturing. The present technology research focus mainly on the sub-micron and smaller semiconductor devices to manufacture highly reliable and densely arranged integrated circuits.

Transistors, or more specifically metal oxide semiconductor (MOS) transistors, are the most important and frequently employed devices in the integrated circuits. However, with the continuous narrowing of device size, the sub-micrometer scale MOS transistors have to face many risky challenges. As the MOS transistors become narrower and thinner accompanying with shorter channels, problems like the junction punchthrough, the leakage, and the contact resistance reduce the yield and the reliability of the semiconductor manufacturing. The technologies like the self-aligned silicide (salicide) and the shallow junctions are utilized in combating the undesirable effects to fabricate the densely packed devices with good yield.

The electrostatic discharge (ESD) attacking becomes a serious problem as the feature size of the MOS transistors scales down. A semiconductor device having the input/output pad connections with external circuitry and devices is subject to the problem of the ESD. The ESD is easily conducted through the input/output and the power lead connections into the internal devices and causes some problems to the semiconductor devices, especially serious ones like the gate oxide breakdown and the overheat damages. The high voltage gradient generated between the contacts and the channels from the ESD causes the gate oxide electron injection and the carrier acceleration effect in the channel. The characteristics and operations of the devices are easily damaged by the inducing effects of the ESD. A high level of ESD with several hundred volts to a few thousand volts, which is easily transferred to the pins of an IC package during handling can bring a permanent destruction to the internal devices. For preventing the devices from the ESD damaging, a built-in ESD protection circuits are connected between the input/output pads and the internal circuitry. A high level of undesired discharge conducted into the pins of an IC package is kept out by the ESD protection circuits from flowing into the devices. The discharges are guided through the ESD protection circuits to the ground and the damage to the semiconductor devices is eliminated.

Several improvements in combating the ESD problem by forming the ESD protection devices have been provided previously. For example, U.S. Pat. No. 5,559,352 to C. C. Hsue and J. Ko disclosed a method of forming an ESD protection device with reduced breakdown voltage. Their invention employed a lightly implanted region of opposite conductivity type with the source/drain regions centered under the heavier implanted source/drain region. As another example, U.S. Pat. No. 5,498,892 to J. D. Walker and S. C. Gioia disclosed a lightly doped drain ballast resistor. A field effect transistor with an improved electrostatic discharge (ESD) protection using a ballast resistor in the drain region is identified. The ballast resistor laterally distributes current along the width of the drain during an ESD pulse, which reduces local peak current density and reduces damage. But the operation speed problem with small feature size devices is still not solved. In addition, for applying most of the improvements, great efforts are needed with the variations needed in the semiconductor manufacturing circuits and the costs are raised.

In manufacturing the sub-micron feature size semiconductor devices, the salicide technology is a vital application to improve the operation speed of the ULSI/VLSI MOS devices. As mentioned in the work of P. Fornara and A. Poncet, the salicide process is one of the most efficient ways of obtaining self-aligned low resistive contacts in CMOS and BiCMOS technologies ("Modeling of Local Reduction in TiSi2 and CoSi2 Growth Near Spacers in MOS Technologies: Influence of Mechanical Stress and Main Diffusing Species", IEDM Tech. Dig., P. 73, 1996).

Unfortunately, there exists some trade-off in employing the technologies like self-aligned silicide when facing the ESD problem. The devices with the self-aligned silicided contacts show a worse ESD performance than the non-salicided devices. In general, thicker salicide has a negative effect on the ESD protection and makes the semiconductor devices to be more sensitive to the ESD voltage and damaged easily by that. The details are explored by the investigation of A. Amerasekera et al. ("Correlating Drain Junction Scaling, Salicide Thickness, and Lateral NPN behavior with the ESD/EOS Performance of a 0.25 $\mu$m CMOS Process.", IEDM Tech. Dig., p. 893, IEEE 1996) Their investigation presents the physical mechanisms involved in the degradation of ESD performance with shallower junctions, thicker salicides, and different epitaxial thicknesses. The ESD challenge of salicide technology with the smaller scale devices can be clearly understood by referencing their work.

SUMMARY OF THE INVENTION

MOS transistors with a self-aligned silicide and ESD protecting transistors are formed on a semiconductor substrate with the method of the present invention. The ESD protection devices in the ESD protective region can be formed simultaneously with the NMOS, the PMOS, or both kinds of transistors in the functional region, with the least addition and modification with the conventional manufacturing steps. The efforts in lithography processes for forming additional transistors for ESD protection can be greatly reduced. A lightly doped drain (LDD) structure and an ultra-shallow junction are formed within the devices by the method disclosed. The short channel effect and it's accompanying hot carrier effect is eliminated. ESD damage from external connections to the integrated circuits are kept from the densely packed devices. The self-aligned silicide (salicide) technology employed in the present invention for forming the contacts with both low resistance and capacitance provides high gate switching and operation speed with a low RC delay. Integrated circuits with ESD hardness, high circuit operation speed, and low power consumption of the functional devices are provided by the semiconductor manufacturing process employing the method disclosed.

The method of forming a MOS transistor in a semiconductor substrate with the self-aligned silicide contact for ESD protection includes the following steps. At first, an isolation region is formed in a semiconductor substrate. The isolation region separates the semiconductor substrate into an ESD protective region for one or more transistors, and a functional region for the integrated circuit devices. Then a gate insulator layer is formed on both the ESD protective region and the functional region. A polysilicon layer is formed above following the formation of the gate insulator layer. The polysilicon layer is then patterned to form a gate structure. The semiconductor substrate is doped with a first concentration of a first dopant type to form a lightly doped region in the semiconductor substrate under a region uncovered by the gate structures in the ESD protective region and the functional region. The ESD protective region is then doped with a second concentration of a second dopant type by a tilted angle implantation process. A junction region is formed by the doping in the semiconductor substrate of the ESD protective region.

A covering layer is then formed over the ESD protective region and a first dielectric layer is formed over the semiconductor substrate. A portion of the first dielectric layer and a portion of the gate insulator layer uncovered by the gate structure are removed to form a spacer structure surrounding the gate structure in the functional region. A silicidation process is performed to form a metal silicide layer on the semiconductor substrate and the gate structure in the functional region. The metal silicide layer is then doped with a third concentration of a third dopant type. A second dielectric layer is formed over the semiconductor substrate. A thermal process is then performed for diffusing the third dopant type into the semiconductor substrate to form a junction region in the functional region to finish the process.

In addition, a metallization process can be performed for making conductive contacts to the active regions. In general, the aforementioned covering layer can be formed by a liquid phase deposition (LPD) of an oxide layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 1 illustrates a cross sectional view of the semiconductor substrate with an isolation region, a gate insulator layer and gate structures on both the ESD protective region and the functional region in the present invention.

FIG. 2 illustrates a cross sectional view of doping the ESD protective region with a second concentration of a second dopant type by a tilted angle implantation process in the present invention.

DETAILED DESCRIPTION OF THE PREFERRED EMBODIMENT

Figure 3:
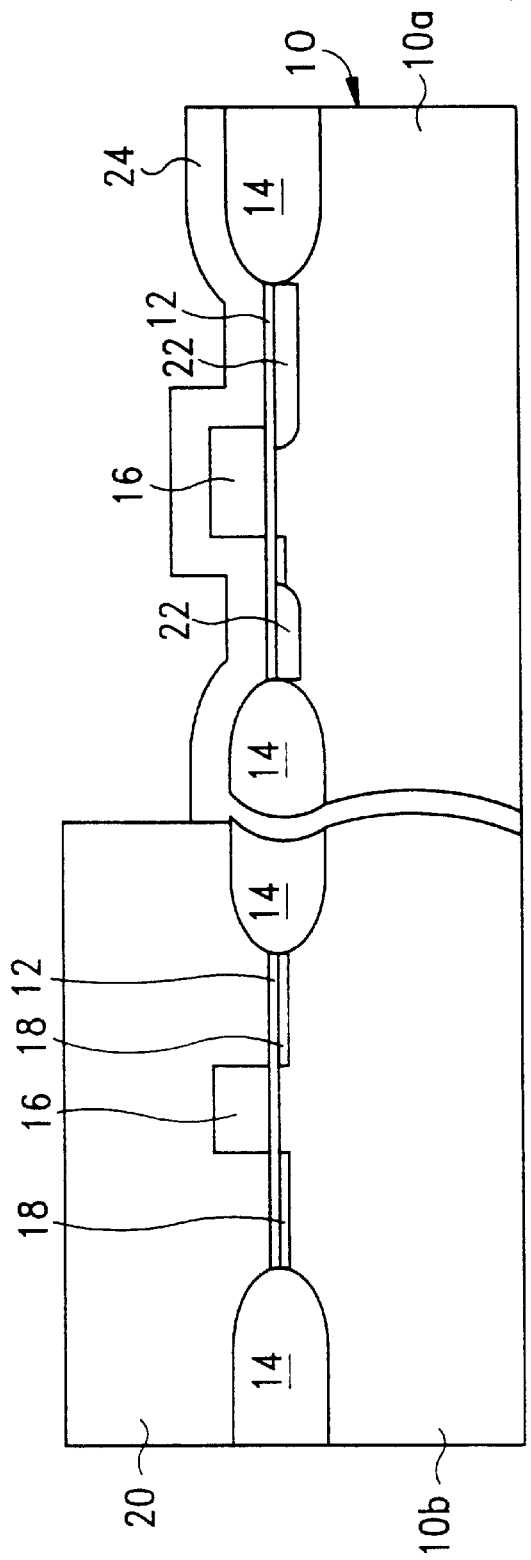
FIG. 3 illustrates a cross sectional view of forming a covering layer over the ESD protective region in the present invention.

A method of forming self-aligned silicided MOS transistors and ESD (electrostatic discharge) protecting transistors simultaneously in the semiconductor fabricating processes is provided in the present invention. Via ESD protecting transistors, any undesirable high voltage discharge can be conducted to the ground through the substrate and thus the internal devices are prevented from the damaging. The efforts needed for forming additional ESD protecting transistors in the conventional process can be greatly reduced by forming selectively a covering layer on an ESD protective region. The functional devices with ultra-shallow source/drain junction can be achieved by utilizing a metal silicide layer as a diffusion source. The contacts formed by a salicidation process improve the circuit operation speed. By the formation of the asymmetric ESD protection transistors, the ESD hardness can be enhanced. The method can be incorporated into conventional semiconductor manufacturing processes for manufacturing the NMOS, the PMOS, or both kind of transistors in a functional region. One, or generally more, ESD protection MOS transistors are formed in a ESD protective simultaneously with only cost efficient modification of the semiconductor manufacturing processes. The method for forming the small feature size devices like sub-micrometer scale or narrower devices overcoming present low ESD hardness problem and operation speed challenges is described as follows.

The method and the steps in the present invention applied on a semiconductor wafer can create the NMOS transistors and the MOS transistors with improved ESD protecting characteristics at the same time. The PMOS transistors can also be built at the same time with some modifications. Since the variations in the processes for incorporating the formation of the PMOS transistors are well known in the art, the details are not described. Referring to FIG. 1, a semiconductor substrate 10 with a preferable single crystalline silicon in a <100> direction is provided. An isolation region, like the field oxide (FOX) region 14, is formed on the semiconductor substrate.

In general, a thin silicon oxide layer 12, as a gate insulator layer, is thermally grown on the semiconductor substrate 10 with the thickness in the range of about 20 angstroms to 300 angstroms. A silicon nitride layer, which is not shown in the figure, is then deposited thereon. The silicon nitride layer is utilized as a layer for inhibiting the FOX growth on an active region of the semiconductor substrate. The silicon nitride layer is then patterned to etch off the region for forming the FOX. The semiconductor substrate is subjected to a thermal process, for example, a dry or wet thermal process performed in an oxygen containing ambient. The region of the silicon oxide layer 12 uncovered by the silicon nitride layer is grown to be the FOX region 14, which serves as the isolation region as indicated in the figure. The FOX region 14 separates the semiconductor substrate into an ESD protective region 10a for transistors on ESD protection, and a functional region 10b for integrated circuit devices. The silicon nitride layer is then removed using etchants like hot phosphoric acid solution. The isolation region can be created through other isolation technologies which are known in the art, like trench isolation and so on, with the same purpose in defining and isolating respective regions.

A polysilicon layer is then deposited onto the semiconductor substrate 10. As an example, the process like a low pressure chemical deposition (LPCVD) process can be used in forming the polysilicon layer. Then a patterning process is performed to define gate structures 16 on both the ESD protective region 10a and the functional region 10b, as shown in FIG. 1. The patterning of the polysilicon layer can be done by the method like a lithography process and an anisotropic etching using an etchant within the great variety of choices like $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$. A doping process to the semiconductor substrate with a first concentration of a first dopant type is performed using the gate structure 16 as a mask. A lightly doped region 18 in both the ESD protective region 10a and the functional region 10b is created by the doping process. The doping process can be performed with an ion implantation of phosphorous or arsenic containing ions for forming NMOS transistors. As an example, the ion implantation is performed at an energy between about 10 KeV to 100 KeV and at a dose between about 1E12 to 1E14 atoms/$cm^2$.

Referring to FIG. 2, the ESD protective region 10a is then doped with a second concentration of a second dopant type. A tilted angle implantation process is employed for forming a junction region 22 with asymmetric structure on the two sides of the gate structure 16, only in the ESD protective region 10a. The details and advantages of the ESD transistors with an asymmetric structure in enhancing ESD hardness can be referenced in accordance with the U.S. Pat. No. 5,386,134 to T. Y. Huang ("Asymmetric Electro-Static Discharge Transistors for Increased Electro-Static Discharge Hardness"). For preventing the functional region 10b from the ion implantation region, a photoresist layer 20 can be formed to cover the functional region 10b before the doping process. The tilted angle implantation process can be performed in a single direction with a tilted angle of about 10 degrees to 60 degrees, at an energy between about 5 KeV to 150 KeV and at a dose between about 1E14 to 5E16 atoms/$cm^2$. For forming NMOS transistors, the second dopant type can be arsenic containing dopants or phosphorous containing dopants.

Referring to FIG. 3, a covering layer 24 is formed over the ESD protective region 10a. The covering layer 24 is used to cover the ESD protective region 10a in the following steps in order to form the devices solely on the functional regions 10b. An oxide layer formed by liquid phase deposition (LPD) process can be utilized as the covering layer 24. As an example, the thickness of the LPD oxide layer 24 is about 500 angstroms to 3,000 angstroms. With the selective deposition characteristics of the LPD oxide only with the proper silicon material like the semiconductor substrate 10, the LPD oxide layer 24 is formed only on the ESD protective region 10a. The photoresist layer 20 acts like a depositing mask over the functional regions 10b during the formation of the covering layer 24. Thus the efforts needed for using the conventional lithography process to select the covering region can be reduced significantly. For more details on the LPD process, the work of H. Nagayama et al. ("A New Process for Silica Coating", in Journal of Electrochemical Society, vol. 135, p.2013, 1988) can be referenced. The new process named liquid phase deposition (LPD) was found by them. In the LPD process, a uniform and dense silica (silicon dioxide) film can be deposited. The process disclosed by them is simple to operate and the equipment required is very inexpensive. The coating conditions and the film properties are reported in comparing them with those of various silica films prepared by other methods in the paper. The results showed that the LPD film made at low temperature had a dense structure and a great alkali barrier effect.

Figure 4:
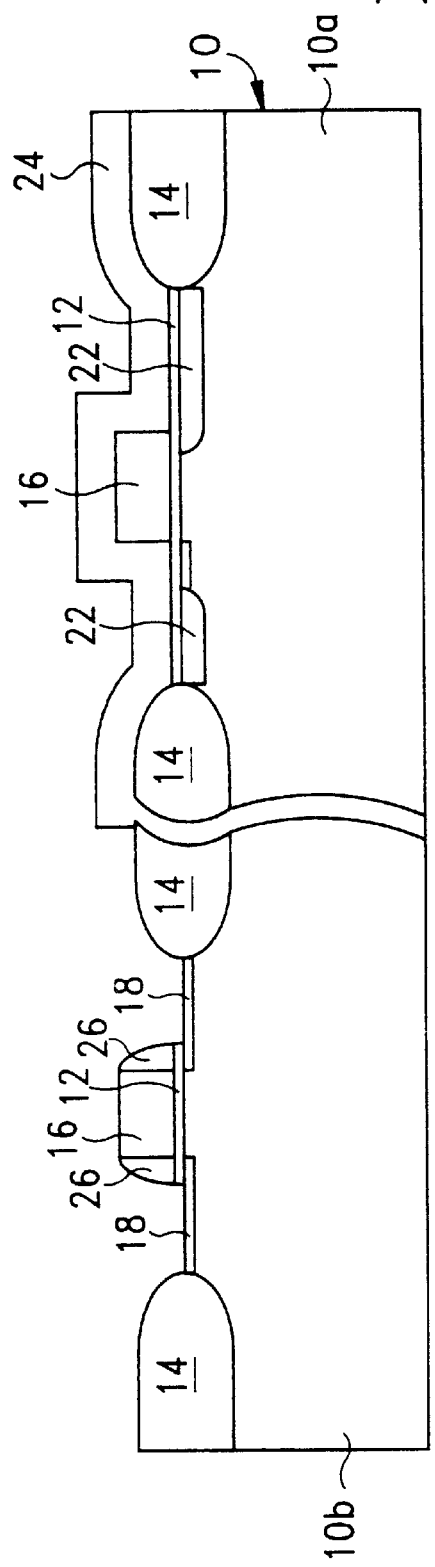
FIG. 4 illustrates a cross sectional view of forming a spacer structure surrounding the gate structure in the functional region in the present invention.

The photoresist layer 20 covering above the functional regions 10b are then removed, as shown in FIG. 4. A first dielectric layer is formed over the semiconductor substrate 10. In the preferred embodiment, the first dielectric layer 26 can be an oxide layer formed by chemical vapor deposition. A portion of the first dielectric layer 26 and a portion of the gate insulator layer 12 uncovered by the gate structure 16 is then removed for forming a spacer structure 26 surrounding the gate structure 16 in the functional region 10b. The removing of portions of the first dielectric layer 26 the gate insulator layer 12 can be performed by an plasma enhanced etching process with etchants like $CF_4$, $CCl_2F_2$, $CHF_3/CF_4$, $CHF_3/O_2$, $CH_3CHF_2$.

Figure 5:
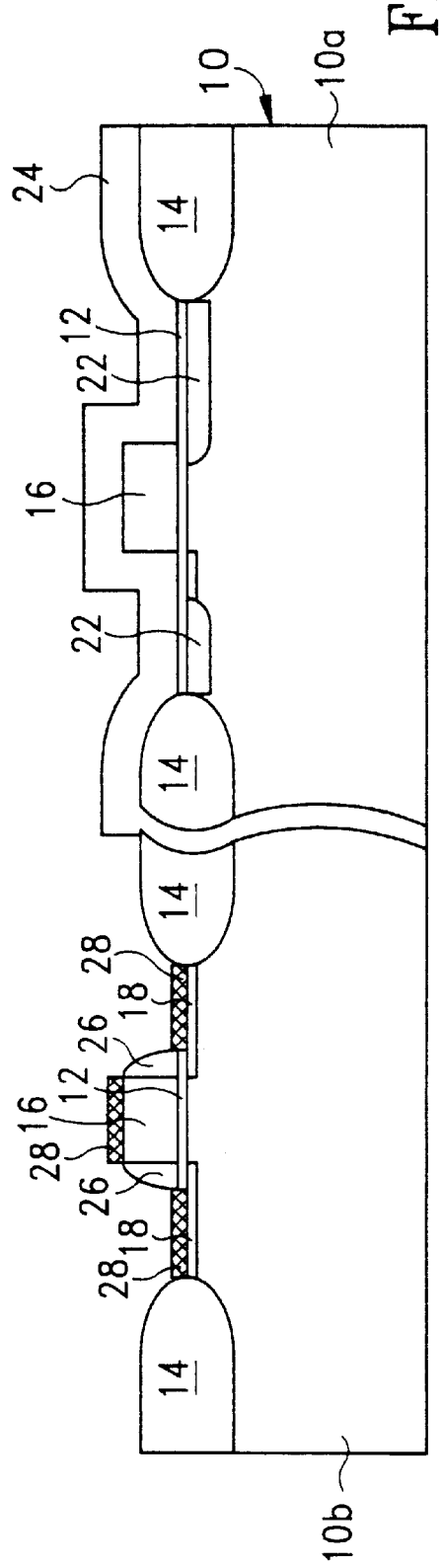
FIG. 5 illustrates a cross sectional view of performing a silicidation process to form a metal silicide layer on the semiconductor substrate and the gate structure in the functional region in the present invention.

Referring to FIG. 5, a silicidation process is then performed to form a metal silicide layer 28 on top of the semiconductor substrate 10 and the gate structure 16 in the functional region 10b. In general, a series of steps are employed to form the metal silicide layer 28 selectively on the active regions of the functional region 10b. A metal layer is formed on the semiconductor substrate 10 using the method like a sputtering process generally with a thickness of about 100 angstroms to 1,000 angstroms. Refractory metal materials like Ti, Co, W, Ni, Pt, and etc. can be used. Then a thermal process for silicidation, preferably a rapid thermal process (RTP) in a nitrogen ambient with a temperature of about 600° C. to 1,000° C., is performed. A metal silicide layer 28 is formed on the top surface of the gate structure 16 and the top surface of exposed portion of the semiconductor substrate 10, namely the junction region in the functional region 10b. An unreacted portion of the metal layer is left on top of the isolation region 14, the spacer structure 26, and the covering layer 24. The unreacted metal layer are then removed to finish the salicidation process. The removing of the unreacted metal layer can be achieved by a wet etching using a solution like a mixture containing $NH_4OH$, $H_2O$, and $H_2O_2$ as an example.

Figure 6:
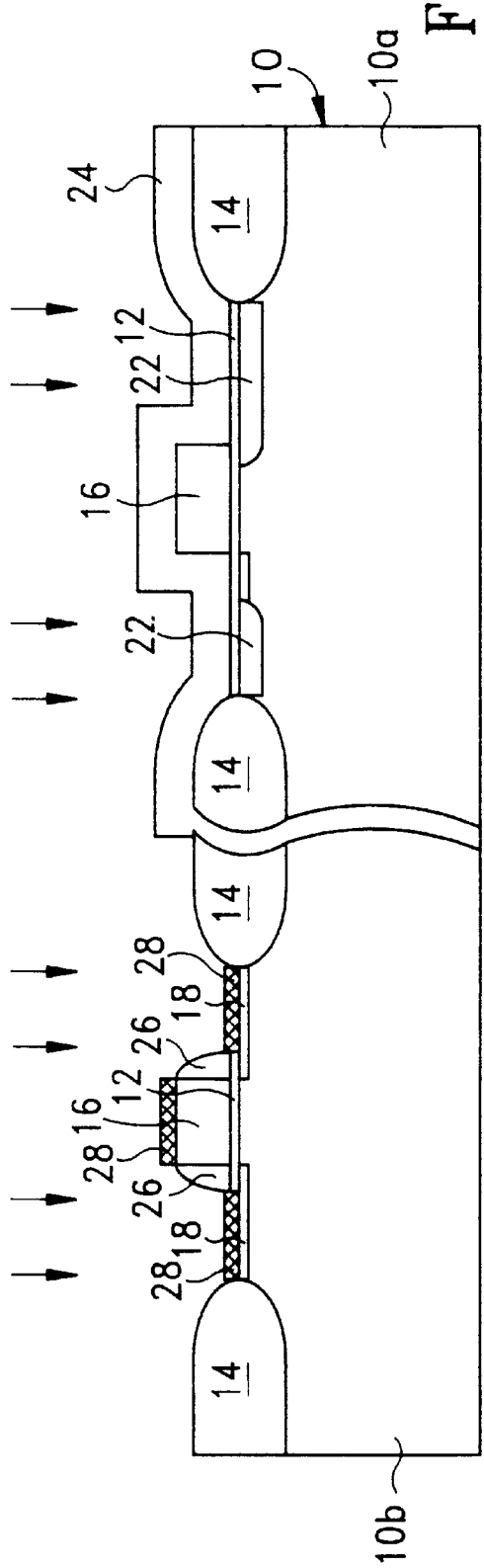
FIG. 6 illustrates a cross sectional view of doping the metal silicide layer with a third concentration of a third dopant type in the present invention.

A doping process is then performed to dope the metal silicide layer 28 with a third concentration of a third dopant type, as shown in FIG. 6. Most of the dopants are placed in the metal silicide layer 28 to make it as a diffusion source in a later thermal process. The doping can be done with an ion implanting process with an energy between about 0.5 KeV to 120 KeV at a dose between about 5E14 to 5E16 atoms/cm$^2$. For forming NMOS transistors, the dopants like arsenic containing dopants and phosphorous containing dopants can be used.

Figure 7:
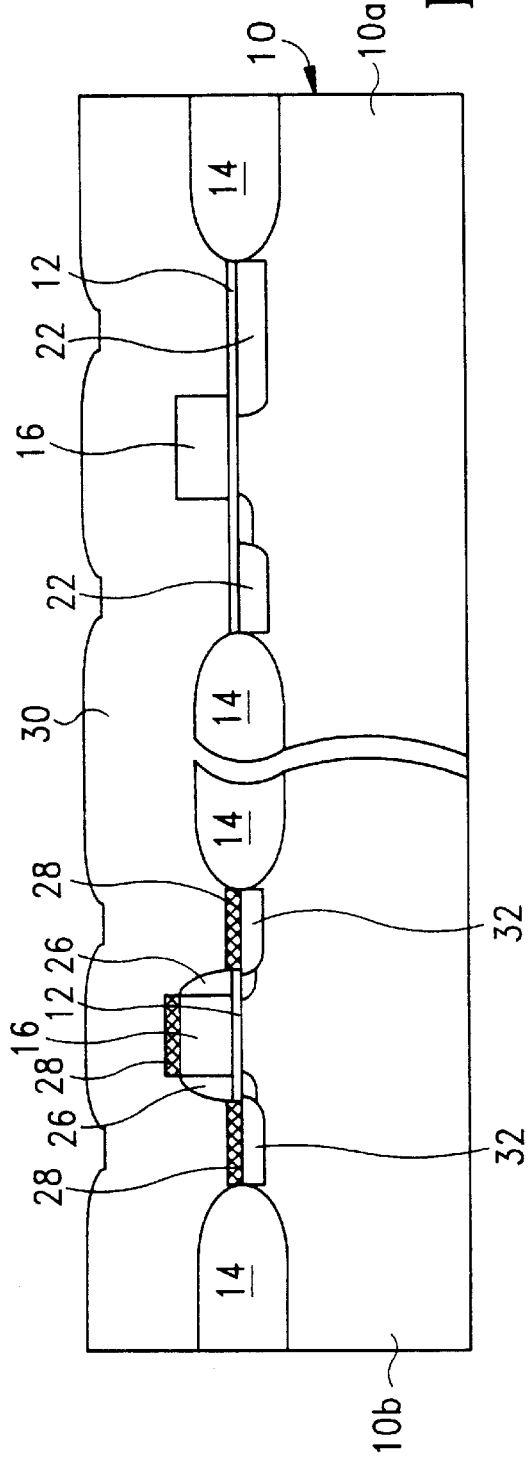
FIG. 7 illustrates a cross sectional view of forming a second dielectric layer over the semiconductor substrate in the present invention.

Referring to FIG. 7, a second dielectric layer 30 is formed over the semiconductor substrate 10 both on the ESD protective region 10a and the functional region 10b. In the case, an oxide layer formed by chemical vapor deposition is used as the second dielectric layer 30. A thermal process is then performed for diffusing the third dopant type in metal silicide layer 28 into the semiconductor substrate 10 located under. A rapid thermal process (RTP) with a temperature of about 850° C. to 1150° C. can be used. An ultra-shallow junction region 32 is formed in the functional region 10b for high speed circuit operation.

The details of the silicide as the diffusion source can be found in the work of F. L. Via and E. Rimini ("Electrical Characterization of Ultra-Shallow Junctions Formed by Diffusion from a CoSi$_2$ Layer", in IEEE Transactions on Electron Devices, vol. 44, No. 4, 1997). It is disclosed that the Silicide-As-Diffusion-Source (SADS) process has been shown to be a viable way to fabricate junction with depths less than 0.1 micrometer to remove the short channel effect and in the meantime to reduce the sheet resistance. In the SADS process dopant is implanted into a silicide and subsequently diffused into the underlying substrate. Advantages like low implantation damage, low thermal budget process, conformal junction, and high concentration are addressed. The dopants in the lightly doped region (LDD) 18 and the junction region of ESD protecting transistors 22 are also diffused and activated during the thermal process. The CVD oxide layer 30 is also condensed for better dielectric characteristics at the same time. Thus the self-aligned silicided MOS transistors in the functional region 10b and the ESD protecting transistors in the ESD protective region 10a are formed.

Figure 8:
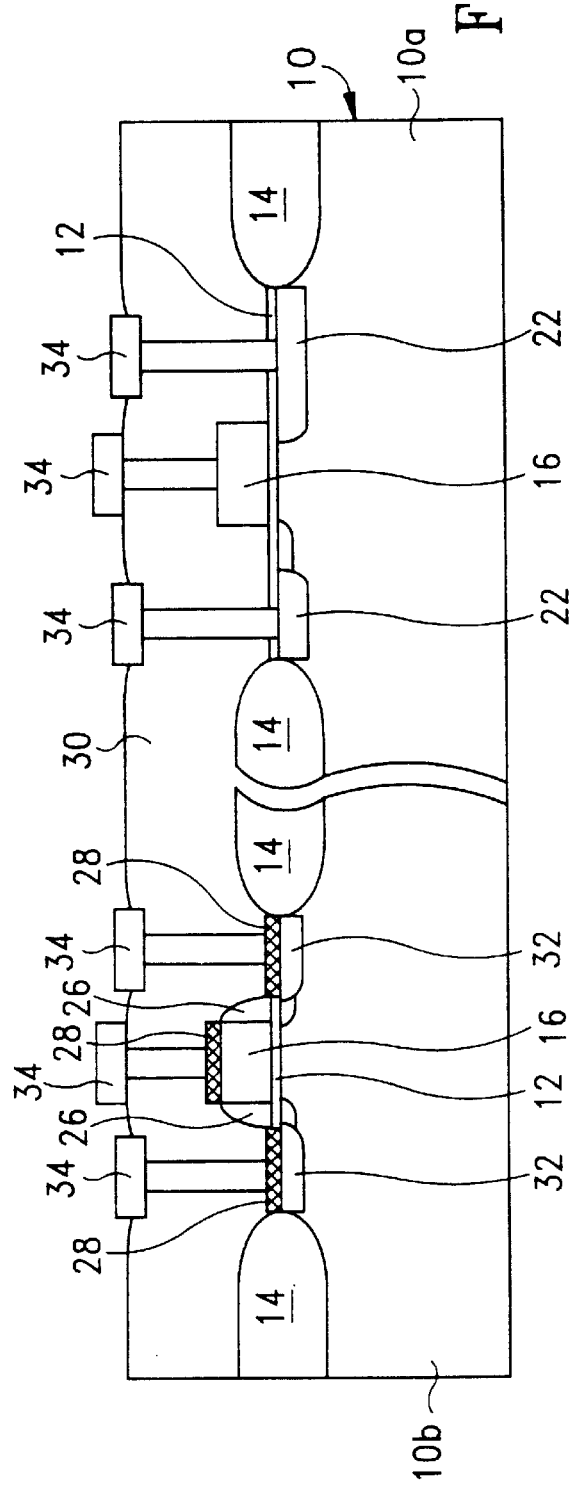
FIG. 8 illustrates a cross sectional view of performing a metallization process to form conductive contacts to the gate structures and junctions in the functional region and the ESD protective region in the present invention.

In addition, a metallization process can be performed for making the interconnections and contacts 34, as shown in FIG. 8. The metallization process includes a series process of opening contact windows and filling conductive layers to form conductive contacts to the active regions of the functional region 10b and the ESD protective region 10a. The process is well known in the art and thus the details are not described here.

The self-aligned silicided MOS transistors and ESD protecting transistors are formed simultaneously in the semiconductor fabricating processes with the method provided in the present invention. The functional transistors with ultra-shallow source/drain junction can be achieved by using the metal silicide layer as a diffusion source. The circuit operation speed can be significantly improved by the self-aligned silicide contacts and the ultra-shallow junction of the functional transistors. The ESD hardness can also be greatly raised by the asymmetric ESD protecting transistors formed by the ion implantation process performed with a tilted angle. The hot carrier effect accompanying with the short channels can be eliminated. A high operation or gate switching speed can be achieved with low heat generation and power consumption.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming transistors in a semiconductor substrate, said method comprising the steps of:

forming an isolation region in said semiconductor substrate, said isolation region separating said semiconductor substrate into an ESD protective region and a functional region;

forming a gate insulator layer on both said ESD protective region and said functional region;

forming a polysilicon layer on said gate insulator layer;

patterning said polysilicon layer to form gate structures on said ESD protective region and on said functional region;

doping said semiconductor substrate with a first concentration of a first dopant, for forming a lightly doped region in said semiconductor substrate under a region uncovered by said gate structures in said ESD protective region and said functional region;

doping said ESD protective region with a second concentration of a second dopant by a tilted angle implantation process, for forming a junction region in said semiconductor substrate of said ESD protective region;

forming a covering layer over said ESD protective region;

forming a first dielectric layer over said semiconductor substrate;

removing a portion of said first dielectric layer and a portion of said gate insulator layer uncovered by said gate structure, for forming a spacer structure surrounding said gate structure in said functional region;

performing a silicidation process to form a metal silicide layer on said semiconductor substrate and said gate structure in said functional region;

doping said metal silicide layer with a third concentration of a third dopant;

forming a second dielectric layer over said semiconductor substrate; and performing a thermal process for diffusing said third dopant into said semiconductor substrate to form a junction region in said functional region.

2. The method of claim 1 further comprising a step of performing a metallization process to form conductive contacts to said gate structures and junctions in said functional region and said ESD protective region.

3. The method of claim 1, wherein said isolation region comprises a field oxide isolation, said field oxide isolation being formed by growing a portion of said semiconductor substrate to separate said semiconductor substrate into said ESD protective region and said functional region.

4. The method of claim 1, wherein said gate insulator layer comprises a silicon oxide which is grown thermally in an oxygen ambient on said semiconductor substrate to a thickness of about 20 angstroms to 300 angstroms.

5. The method of claim 1, wherein said step of doping with said first concentration of said first dopant is performed by a first ion implanting process with an energy between about 10 KeV to 100 KeV at a dose between about 1E12 to 1E14 atoms/cm$^2$, said first dopant is selected from the group consisting of arsenic containing dopants and phosphorous containing dopants.

6. The method of claim 1, wherein said tilted angle implantation process is performed with a tilted angle of about 10 degrees to 60 degrees, at an energy between about 5 KeV to 150 KeV and a dose between about 1E14 to 5E16 atoms/cm$^2$, said second dopant is selected from the group consisting of arsenic containing dopants and phosphorous containing dopants.

7. The method of claim 1, wherein said covering layer is formed by a liquid phase deposition (LPD) of an oxide layer with a thickness of about 500 angstroms to 3,000 angstroms.

8. The method of claim 1, wherein said first dielectric layer is an oxide layer formed by chemical vapor deposition.

9. The method of claim 1, wherein said silicidation process comprises the steps of:
   forming a metal layer on said semiconductor substrate;
   performing a thermal process for silicidation to said semiconductor substrate to form said metal silicide layer on top of said semiconductor substrate and of said gate structure in said functional region; and
   removing an unreacted portion of said metal layer.

10. The method of claim 1, wherein said metal layer comprises a metal selected from the group consisting of Ti, Co, W, Ni and Pt.

11. The method of claim 1, wherein said thermal process for silicidation is performed with a rapid thermal process in a nitrogen ambient with a temperature of about 600° C. to 1,000° C.

12. The method of claim 1, wherein said step of doping with said third concentration of said third dopant is performed by a third ion implanting process with an energy between about 0.5 KeV to 120 KeV at a dose between about 5E14 to 5E16 atoms/cm$^2$, said third dopant is selected from the group consisting of arsenic containing dopants and phosphorous containing dopants.

13. The method of claim 1, wherein said second dielectric layer is an oxide layer formed by chemical vapor deposition.

14. The method of claim 1, wherein said thermal process is performed with a rapid thermal process with a temperature of about 850° C. to 1150° C.

15. A method of forming transistors in a semiconductor substrate, said method comprising the steps of:
   forming an isolation region in said semiconductor substrate, said isolation region separating said semiconductor substrate into an ESD protective region and a functional region;
   forming a gate insulator layer on both said ESD protective region and said functional region;
   forming a polysilicon layer on said gate insulator layer;
   patterning said polysilicon layer to form gate structures on said ESD protective region and on said functional region;
   doping said semiconductor substrate with a first concentration of a first dopant, for forming a lightly doped region in said semiconductor substrate under a region uncovered by said gate structures in said ESD protective region and said functional region;
   doping said ESD protective region with a second concentration of a second dopant by a tilted angle implantation process, for forming a junction region in said semiconductor substrate of said ESD protective region;
   forming a covering layer over said ESD protective region, said covering layer being formed by a liquid phase deposition (LPD) of an oxide layer with a thickness of about 500 angstroms to 3,000 angstroms;
   forming a first dielectric layer over said semiconductor substrate, said first dielectric layer being a first chemical vapor deposited (CVD) oxide layer;
   removing a portion of said first dielectric layer and a portion of said gate insulator layer uncovered by said gate structure, for forming a spacer structure surrounding said gate structure in said functional region;
   performing a silicidation process to form a metal silicide layer on said semiconductor substrate and said gate structure in said functional region, said silicidation process comprising the steps of:
      forming a metal layer on said semiconductor substrate, said metal layer comprising a metal selected from the group consisting of Ti, Co, W, Ni and Pt;
      performing a thermal process for silicidation to said semiconductor substrate to form said metal silicide layer on top of said semiconductor substrate and of said gate structure in said functional region; and
      removing an unreacted portion of said metal layer;
   doping said metal silicide layer with a third concentration of a third dopant;
   forming a second dielectric layer over said semiconductor substrate, said second dielectric layer being a second CVD oxide layer; and
   performing a thermal process for diffusing said third dopant into said semiconductor substrate to form a junction region in said functional region.

16. The method of claim 15 further comprising a step of performing a metallization process to form conductive contacts to said gate structures and junctions in said functional region and said ESD protective region.

17. The method of claim 15, wherein said isolation region comprises a field oxide isolation, said field oxide isolation being formed by growing a portion of said semiconductor substrate to separate said semiconductor substrate into said ESD protective region and said functional region.

18. The method of claim 15, wherein said gate insulator layer comprises a silicon oxide which is grown thermally in an oxygen ambient on said semiconductor substrate to a thickness of about 20 angstroms to 300 angstroms.

19. The method of claim 15, wherein said step of doping with said first concentration of said first dopant is performed by a first ion implanting process with an energy between about 10 KeV to 100 KeV at a dose between about 1E12 to 1E14 atoms/cm$^2$, said first dopant is selected from the group consisting of arsenic containing dopants and phosphorous containing dopants.

20. The method of claim 15, wherein said tilted angle implantation process is performed with a tilted angle of about 10 degrees to 60 degrees, at an energy between about 5 KeV to 150 KeV and a dose between about 1E14 to 5E16 atoms/cm$^2$, said second dopant is selected from the group consisting of arsenic containing dopants and phosphorous containing dopants.

21. The method of claim 15, wherein said thermal process for silicidation is performed with a rapid thermal process in a nitrogen ambient with a temperature of about 600° C. to 1,000° C.

22. The method of claim 15, wherein said step of doping with said third concentration of said third dopant is performed by a third ion implanting process with an energy between about 0.5 KeV to 120 KeV at a dose between about 5E14 to 5E16 atoms/cm$^2$, said third dopant is selected from the group consisting of arsenic containing dopants and phosphorous containing dopants.

23. The method of claim 15, wherein said thermal process is performed with a rapid thermal process with a temperature of about 850° C. to 1150° C.

* * * * *